(12) United States Patent
Fritzsche et al.

(10) Patent No.: US 6,523,399 B2
(45) Date of Patent: Feb. 25, 2003

(54) CONTROL UNIT FOR A MOTOR VEHICLE

(75) Inventors: Christian Fritzsche, Regensburg (DE); Helmut Gander, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 41 days.

(21) Appl. No.: 09/793,827

(22) Filed: Feb. 26, 2001

(65) Prior Publication Data

US 2001/0018380 A1 Aug. 30, 2001

Related U.S. Application Data

(63) Continuation of application No. PCT/DE99/02621, filed on Aug. 20, 1999.

(30) Foreign Application Priority Data

Aug. 24, 1998 (DE) ........................................ 198 38 427

(51) Int. Cl.⁷ ............................................. G01M 13/02
(52) U.S. Cl. ..................................................... 73/118.1
(58) Field of Search ............................... 73/118.1, 431, 73/39, 112; 475/158; 340/438, 451

(56) References Cited

U.S. PATENT DOCUMENTS

| | | | |
|---|---|---|---|
| 4,758,695 A | * 7/1988 | Sanford et al. | ............ 200/83 P |
| 5,709,134 A | 1/1998 | Ulm | |
| 2001/0011478 A1 | * 8/2001 | Albert et al. | ................. 73/431 |
| 2002/0089336 A1 | * 7/2002 | Jungbauer et al. | .......... 324/601 |

FOREIGN PATENT DOCUMENTS

| | | |
|---|---|---|
| DE | 29513950 U1 | 2/1997 |
| DE | 29714223 U1 | 1/1998 |
| DE | 29714229 U1 | 1/1998 |

OTHER PUBLICATIONS

"Elektronik im Kraftfahrzeug", Krafthanz, vol. 22, Nov. 1996, pp. 1538–1540 and 1549.

"Silicon sensors", S. Middlehoek et al., Meas. Sci. Technol. 6, 1995, Great Britain pp. 1641–1658.

"Einsatzmöglichkeiten und Zukunftschancen 'intelligenter' Sensoren im Kraftfahrzeug", Frieder Heintz et al., Bosch Technische Berichte 1990, vol. 52, pp. 30–41.

Published International Publication No. 95/30102 (Ulm), dated Nov. 9, 1995.

* cited by examiner

*Primary Examiner*—Eric S. McCall
(74) *Attorney, Agent, or Firm*—Laurence A. Greenberg; Werner H. Stemer; Gregory L. Mayback

(57) ABSTRACT

A control unit has a control circuit and a pressure sensor connected to the control circuit. The pressure sensor measures the hydraulic pressure in a transmission or the induction-pipe vacuum of an engine. A common housing has a metallic base plate, into which a metallic support plate for the pressure sensor is fitted. The support plate has a borehole through which the pressure sensor is subjected to pressure. A metallic ring is secured on the support plate. A glass cylinder is secured on the support plate, and the pressure sensor, which is configured as a silicon chip, is secured on the glass cylinder.

9 Claims, 2 Drawing Sheets

CONTROL UNIT FOR A MOTOR VEHICLE

CROSS-REFERENCE TO RELATED APPLICATION

This application is a continuation of copending International application Ser. No. PCT/DE99/02621, filed Aug. 20, 1999, which designated the United States.

BACKGROUND OF THE INVENTION

FIELD OF THE INVENTION

The invention relates to a control unit for a motor vehicle and in particular to a control unit for a transmission in a motor vehicle and to a control unit for an air induction system in a motor vehicle.

Automatic transmissions and engines for passenger cars are generally electronically controlled by an electronic control system. The electronic control system receives and evaluates, among others, the signals from one or more sensors in the motor vehicle. A sensor of this kind is used, for example, to measure the pressure in the hydraulic fluid of the transmission or the vacuum in the intake section of the engine.

German Utility Model No. DE 295 13 950 U1 discloses a control unit for a motor-vehicle transmission. The transmission has an electronic control circuit connected electrically to at least one pressure sensor for measuring the hydraulic pressure in the transmission, the pressure sensor and the electronic control circuit are accommodated in a common housing.

Control units mounted on or in an assembly—the engine or the transmission of a motor vehicle for example—must be configured with particular care with regard to the dissipation of heat given off by electronic components during operation because of the high ambient temperature. There are many different embodiments of pressure-measuring sensors, e.g. in the form of ceramic pressure cells, metal diaphragms with piezoresistive resistors and various silicon sensors. Common to all embodiments is that to achieve the accuracy required in the automotive industry it is necessary to compensate for manufacturing and assembly tolerances.

Since expensive devices are required to trim sensor systems for pressure and temperature, trimming is generally performed by the manufacturers of the pressure sensor themselves.

German Utility Model No. DE 297 14 223 U1 discloses a transmission control unit that has an electronic control circuit connected electrically to at least one pressure sensor for measuring the hydraulic pressure in the transmission. In this configuration, the electronic control circuit and the pressure sensor are provided in a common control housing. The control housing has a metallic base plate, which is connected pressure-tightly to a hydraulic unit of the transmission. An additional sensor housing is provided for the pressure sensor.

SUMMARY OF THE INVENTION

It is accordingly an object of the invention to provide a control unit which overcomes the above-mentioned disadvantages of the heretofore-known control units of this general type and into which systems that detect pressure can be integrated mechanically and electrically in an economical and reliable manner, taking into account the above-mentioned requirements.

With the foregoing and other objects in view there is provided, in accordance with the invention, in combination with a transmission, in particular an automatic transmission, having a hydraulic unit, a control unit, including:

an electronic control circuit;

at least one pressure sensor electrically connected to the electronic control circuit for measuring a hydraulic pressure in the transmission, the pressure sensor being configured as a silicon chip;

a common housing having a metallic base plate connected pressure-tightly to the hydraulic unit of the transmission;

the pressure sensor and the electronic control circuit being accommodated in the common housing;

a metallic support plate for the pressure sensor, the metallic support plate being fitted into the metallic base plate;

the metallic support plate having an end face disposed in the common housing, and the metallic support plate being formed with a borehole, the pressure sensor being subjected, via the borehole, to a pressure prevailing in the hydraulic unit; and a metallic ring mounted on the end face of the metallic support plate, and the pressure sensor being mounted on the metallic ring.

In other words, the control unit according to the invention has an electronic control circuit, which is connected electrically to at least one pressure sensor for measuring the hydraulic pressure in the transmission. The pressure sensor and the electronic control circuit are accommodated in a common housing that has a metallic base plate, which is connected pressure-tightly to a hydraulic unit of the transmission and into which a metallic support ate for the pressure sensor is fitted. The support plate for the pressure sensor is provided with a hole through which the pressure sensor is subjected to the pressure prevailing in the hydraulic unit. A metallic ring is secured on the end face of the support plate, the end face being disposed in the housing, and a sensor element configured as a silicon chip is mounted on the metallic ring. A glass cylinder can be inserted between the metallic ring and the pressure sensor.

With the objects of the invention in view there is also provided, in combination with an air induction pipe, a control unit, including:

an electronic control circuit;

a pressure sensor electrically connected to the electronic control circuit for measuring an air pressure in the air induction pipe, in particular the vacuum in the air induction pipe, the pressure sensor being configured as a silicon chip;

a common housing having a metallic base plate connected pressure-tightly to the air induction pipe;

the pressure sensor and the electronic control circuit being accommodated in the common housing;

a metallic support plate for the pressure sensor, the metallic support plate being fitted into the metallic base plate;

the metallic support plate having an end face disposed in the common housing, and the metallic support plate being formed with a borehole, the pressure sensor being subjected, via the borehole, to a pressure, in particular the vacuum, prevailing in the air induction pipe; and a metallic ring mounted on the end face of the metallic support plate, and the pressure sensor being mounted on the metallic ring.

The advantages of the invention are in particular the simple and economical integration of a pressure sensor into the pressure-tight and fluid-tight housing of an electronic control circuit. An additional expensive housing for the pressure sensor is no longer necessary, and the electrical contact feed-throughs through the housing are also eliminated. The sensor can be connected to the control circuit economically simply by bonding. The housing can be sealed off from the hydraulic unit through the use of a simple axial O-ring.

According to another feature of the invention, the metal ring has a surface; and a gold coating is provided on the surface.

According to yet another feature of the invention, an O-ring is provided for sealing the metallic support plate from the hydraulic unit.

According to a further feature of the invention, a substrate with electrical trimming elements or adjusting elements is provided, the substrate being provided on the metallic support plate.

According to another feature of the invention, the metallic support plate is composed of a relatively harder metallic material; and the metallic base plate is composed of a relatively softer material.

According to yet another feature of the invention, the metallic support plate is composed of steel; and the metallic base plate is composed of aluminum.

According to yet a further feature of the invention, a glass cylinder is inserted between the metallic ring and the pressure sensor.

According to anoth feature of the invention e transmission is an automatic transmission.

According to another feature of the invention, the control unit is provided for a transmission of a motor vehicle.

Other features which are considered as characteristic for the invention are set forth in the appended claims.

Although the invention is illustrated and described herein as embodied in a control unit in a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
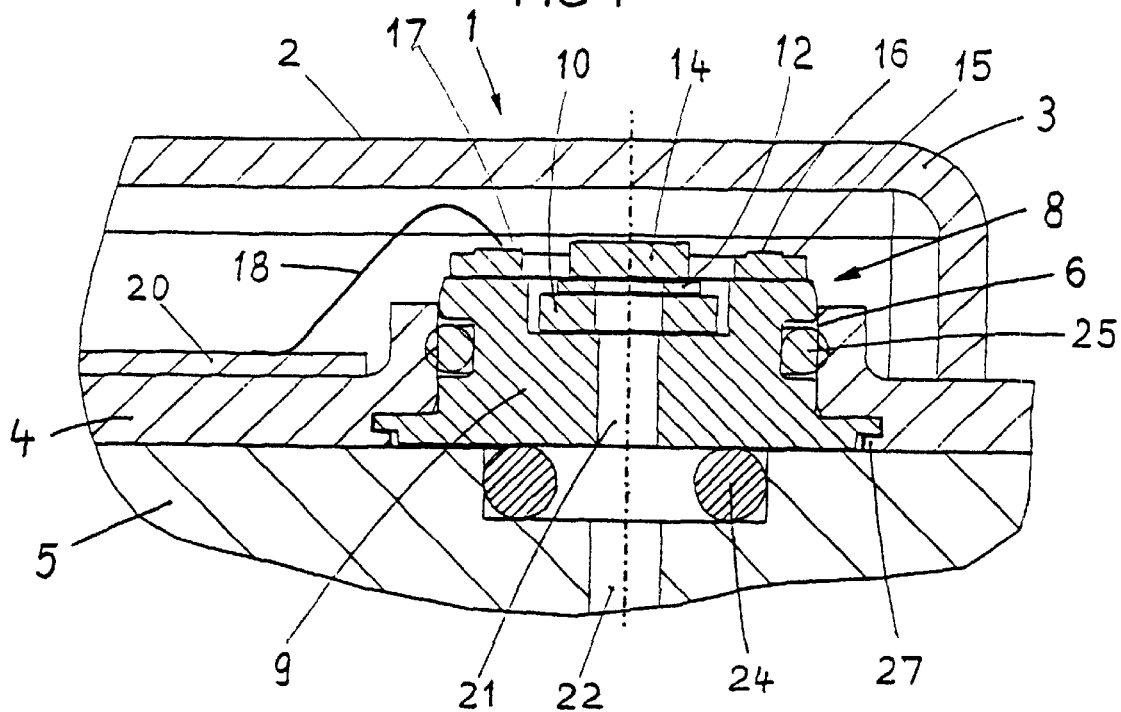
FIG. 1 is a diagrammatic, partial sectional view of a control unit according to the invention integrated into a motor-vehicle transmission.
Figure 2:
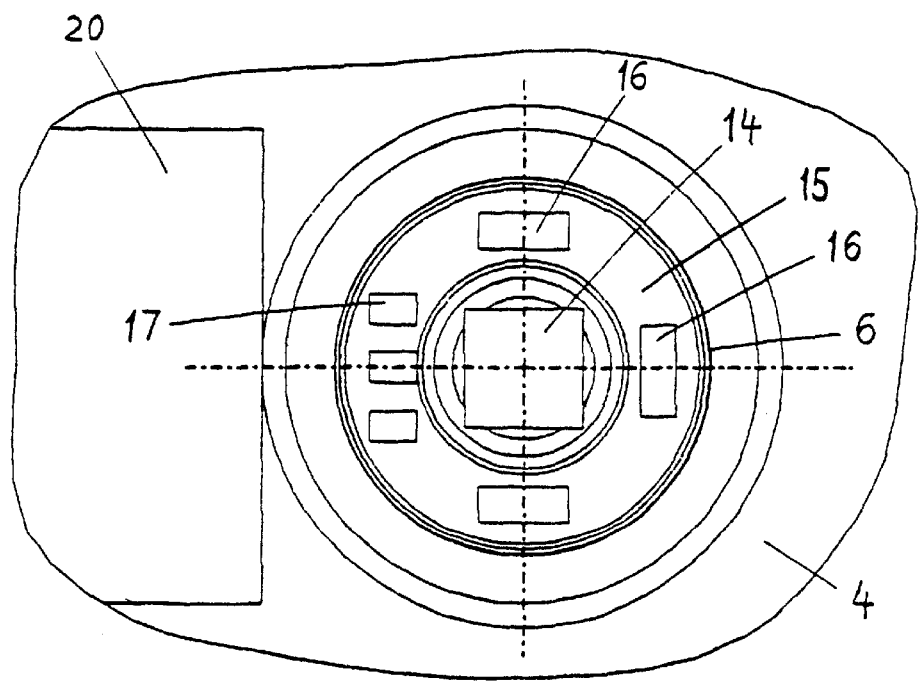
FIG. 2 is a diagrammatic, partial plan view of the control unit shown in FIG. 1 with the cover removed.
Figure 3:
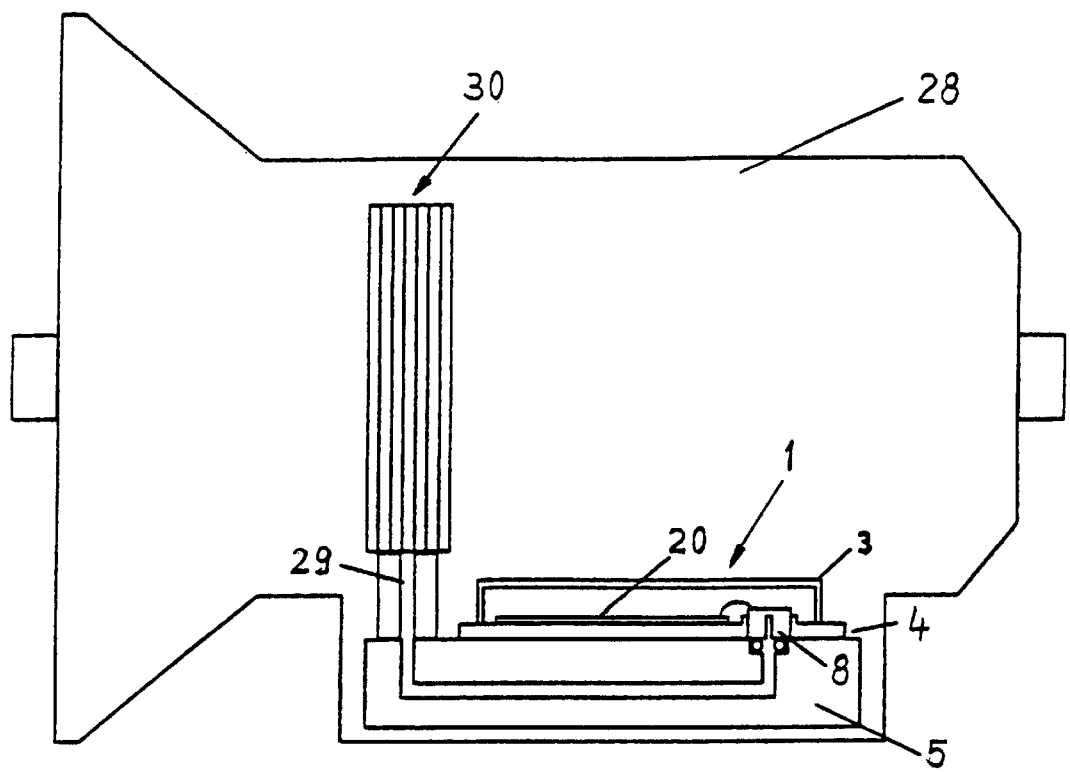
FIG. 3 is a diagrammatic sectional view of a transmission provided with a control unit according to the invention.

Referring now to the figures of the drawings in detail and first, particularly, to FIG. 1 thereof, there is shown a control unit 1 used in a motor vehicle, e.g. a transmission control system, having a housing 2, which includes a cover 3 and a metallic base plate 4 composed, for example, of aluminum. The base plate 4 is secured directly on a hydraulic unit 5 of a transmission (see FIG. 3). The base plate 4 has one or more apertures 6, which are advantageously circular and each serve to accommodate a pressure sensor system 8.

The pressure sensor system 8 has a support plate 9, which is produced from a higher-grade metallic material than the base plate 4, e.g. from steel. A ring 10 made of steel is secured on the support plate 9, e.g. by resistance welding. Provided on the ring 10, in turn, is a glass cylinder 12 which serves to compensate for mechanical stresses. Secured on the glass cylinder 12 is a pressure sensor 14, which is configured as a silicon chip, for example. If required by the particular application, the surface of the ring 10 can be treated in a suitable manner, e.g. provided with a coating of gold.

For electrical trimming of the pressure sensor system 8, there is on the support plate 9 a substrate 15 composed, for example, of ceramic, on which trimming elements 16, which are expediently configured as laser-trimmable resistors, and bond pads 17 are mounted.

The pressure sensor 14 is connected to the trimming elements 16, which form a resistor network, for example. The bond pads 17 and bonding wires 18 are used, on the one hand, to supply the sensor with operating voltage and, on the other hand, to feed the sensor signals to an electronic control circuit 20. Connecting lines on the substrate 15 are not shown in detail but are configured as printed conductor tracks, for example.

The support plate 9 has a hole 21, which is connected to a hole 22 in the hydraulic unit 5. These holes are filled with transmission fluid and, via these holes, the pressure sensor 14 is subjected to the pressure prevailing in the hydraulic unit 5.

The support plate 9 is sealed off from the hydraulic unit 5 by an axial O-ring 24 and from the aperture 6 in the base plate 4 by a radial O-ring 25.

The support plate 9 is secured against falling out of the base plate 4 by a suitable method. This can be accomplished, for example, by caulking the material of the base plate at individual points 27 or by all-round flanging.

The pressure sensor system 8 described here can also be replaced by any other sensor system that has a base plate, can be subjected to pressure from underneath (in the drawing) and has electrical contacts on its upper side.

An automatic transmission 28 (FIG. 3) is provided with a control unit 1 according to the invention. The pressure prevailing in the hydraulic unit 5 has a direct or indirect effect via a pressure conduit 29 on braking and clutch elements 30, through the use of which the shift operations of the transmission are controlled in a known manner. Indirectly means that the pressure is also fed to the braking and clutch elements 30 via an interposed pressure intensifier (not shown here), for example.

Figure 4:
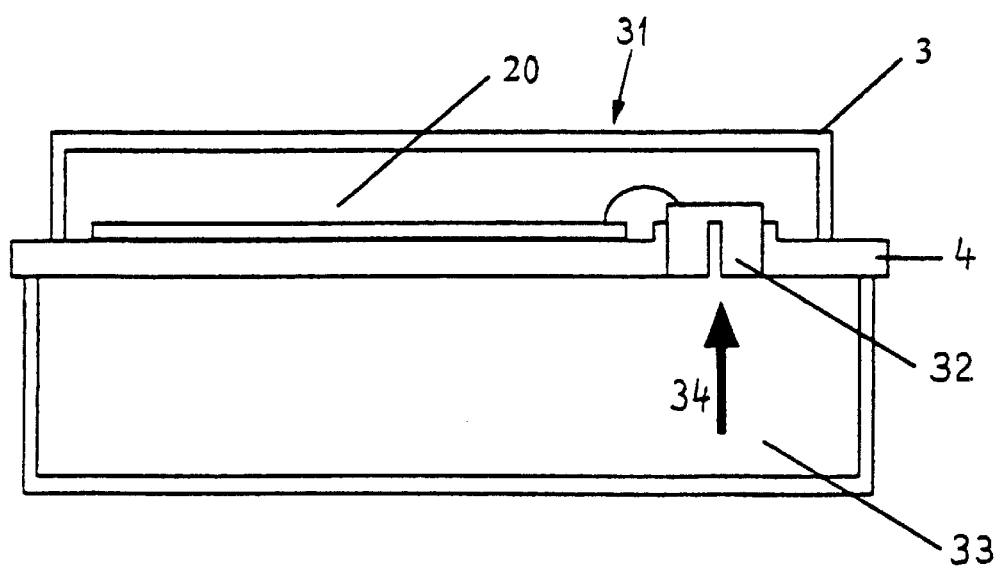
FIG. 4 is a diagrammatic sectional view of a control unit according to the invention installed in the intake section of a motor-vehicle engine.

Another exemplary embodiment of a control unit 1 according to the invention is used as an engine control system (FIG. 4). It has a housing that likewise includes a base plate 4 and a box-shaped cover 3. It contains a pressure sensor system 32, the construction of which corresponds to that of the pressure sensor system 8. Here, the base plate 4 is built into the wall of an induction pipe 33 of the motor-vehicle engine, the pressure sensor system thus detecting the engine induction vacuum, which is evaluated for the purpose of controlling the engine and is indicated in the drawing by an arrow 34.

We claim:

1. In combination with a transmission having a hydraulic unit, a control unit, comprising:
   an electronic control circuit;
   a pressure sensor electrically connected to said electronic control circuit for measuring a hydraulic pressure in the transmission, said pressure sensor being configured as a silicon chip;
   a common housing having a metallic base plate connected pressure-tightly to the hydraulic unit of the transmission;
   said pressure sensor and said electronic control circuit being accommodated in said common housing;
   a metallic support plate for said pressure sensor, said metallic support plate being fitted into said metallic base plate;
   said metallic support plate having an end face disposed in said common housing, and said metallic support plate being formed with a borehole, said pressure sensor being subjected, via said borehole, to a pressure prevailing in the hydraulic unit; and
   a metallic ring mounted on said end face of said metallic support plate, and said pressure sensor being mounted on said metallic ring.

2. The control unit according to claim 1, wherein:
   said metal ring has a surface; and
   a gold coating is provided on said surface.

3. The control unit according to claim 1, including an O-ring for sealing said metallic support plate from the hydraulic unit.

4. The control unit according to claim 1, including a substrate with electrical trimming elements, said substrate being provided on said metallic support plate.

5. The control unit according to claim 1, wherein:
   said metallic support plate is composed of a relatively harder metallic material; and
   said metallic base plate is composed of a relatively softer material.

6. The control unit according to claim 1, wherein:
   said metallic support plate is composed of steel; and
   said metallic base plate is composed of aluminum.

7. The control unit according to claim 1, including a glass cylinder inserted between said metallic ring and said pressure sensor.

8. The control unit according to claim 1, wherein the transmission is an automatic transmission.

9. In a motor vehicle having a transmission with a hydraulic unit, a control unit, comprising:
   an electronic control circuit;
   a pressure sensor electrically connected to said electronic control circuit for measuring a hydraulic pressure in the transmission, said pressure sensor being configured as a silicon chip;
   a common housing having a metallic base plate connected pressure-tightly to the hydraulic unit of the transmission;
   said pressure sensor and said electronic control circuit being accommodated in said common housing;
   a metallic support plate for said pressure sensor, said metallic support plate being fitted into said metallic base plate;
   said metallic support plate having an end face disposed in said common housing, and said metallic support plate being formed with a borehole, said pressure sensor being subjected, via said borehole, to a pressure prevailing in the hydraulic unit; and
   a metallic ring mounted on said end face of said metallic support plate, and said pressure sensor being mounted on said metallic ring.

* * * * *